(12) United States Patent
Grosse

(10) Patent No.: US 7,170,918 B2
(45) Date of Patent: Jan. 30, 2007

(54) RESONANT CAVITY DIODE OPERATING AT THE SAME WAVELENGTH FOR EMISSION AND DETECTION OF LIGHT

(75) Inventor: Philippe Grosse, Sassenage (FR)

(73) Assignee: Commissariat a l'Energie Atomique, Paris (FR)

(*) Notice: Subject to any disclaimer, the term of this patent is extended or adjusted under 35 U.S.C. 154(b) by 183 days.

(21) Appl. No.: 10/895,851

(22) Filed: Jul. 22, 2004

(65) Prior Publication Data
US 2005/0047465 A1 Mar. 3, 2005

(30) Foreign Application Priority Data
Jul. 23, 2003 (FR) .................................. 03 50362

(51) Int. Cl.
*H01S 5/183* (2006.01)
*H01S 5/026* (2006.01)
(52) U.S. Cl. .................. 372/50.21; 372/43.01; 372/46.01
(58) Field of Classification Search ............. 372/50.21
See application file for complete search history.

(56) References Cited

U.S. PATENT DOCUMENTS

| 4,202,000 A | 5/1980 | Carballes |
| 4,948,960 A | 8/1990 | Simms et al. |
| 5,533,041 A | 7/1996 | Matsuda et al. |
| 5,978,401 A * | 11/1999 | Morgan .................. 372/50.21 |

FOREIGN PATENT DOCUMENTS

| EP | 1 041 690 | 10/2000 |
| WO | WO 01/26102 | 4/2001 |

OTHER PUBLICATIONS

S. Strite, et al., "Tunable photodetectors and light-emitting diodes for wavelength division multiplexing", Electronics Letters, vol. 31, No. 8, XP-006002710, Apr. 13, 1995, p. 672-674.
S. M. Zakharov, et al., "Optoelectronic integrated circuits utilising vertical-cavity surface-emitting semiconductor lasers", Quantum Electronics, vol. 29, No. 9, XP-000923961, Sep. 1999, pp. 745-761.

(Continued)

*Primary Examiner*—Minsun Oh Harvey
*Assistant Examiner*—Rory Finneren
(74) *Attorney, Agent, or Firm*—Oblon, Spivak, McClelland, Maier & Neustadt, P.C.

(57) ABSTRACT

Resonant cavity diode, operating at the same wavelength for emission and detection of light.

This diode is particularly applicable to telecommunications and comprises a resonant cavity (12) delimited by two mirrors (8, 16) and containing an active medium (14) and at least two insulating and coaxial rings (24, 30, 32) with the same inside diameter and the same outside diameter, the total thickness of the rings being provided such that the optical length of the resonant cavity is $k \times \lambda$ ($k \geq 2$), in the part of this cavity that passes through the rings, and is $(k-1) \times \lambda$ in the part containing these rings, where $\lambda$ is the wavelength at which the diode is capable of emitting and detecting.

10 Claims, 5 Drawing Sheets

OTHER PUBLICATIONS

Hideo Kosaka, et al., "Pixels Consisting of Double Vertical-Cavity Detector and Single Vertical-Cavity Laser Sections for 2-D Bidirectional Optical Interconnections", Jpn. J. Appl. Phys., vol. 32, No. 1B, Jan. 1993, pp. 600-603.

T. Knödl, et al., "RCE Photodetectors Based on VCSEL Structures", IEEE Photonics Technology Letters, vol. 11, No. 10, Oct. 1999, pp. 1289-1291.

Kent D. Choquette, et al., "Cavity characteristics of selectively oxidized vertical-cavity lasers", Appl. Phys. Lett., vol. 66, No. 25, Jun. 19, 1995, pp. 3413-3415.

K. L. Lear, et al., "Modal analysis of a small surface emitting laser with a selectively oxidized waveguide", Appl. Phys. Lett., vol. 66, No. 20, May 15, 1995, pp. 2616-2618.

Fred. L. Terry, Jr., "A modified harmonic oscillator approximation scheme for the dielectric constants of $Al_xGa_{1-x}As$", J. Appl. Phys, vol. 70, No. 1, Jul. 1, 1991, pp. 409-417.

Martin A. Afromowitz, "Refractive Index of $Ga_{1-x}Al_xA_s$", Solid State Communications, vol. 15, No. 1, 1974, pp. 59-63.

Marek Osinski, et al., "Temperature and Thickness Dependence of Steam Oxidation of AIAs in Cylindrical Mesa Structures", IEEE Photonics Technology Letters, vol. 13, No. 7, Jul. 2001, pp. 687-689.

Bernhard Weigl, "High-Efficiency Selectively-Oxidized MBE-Grown Vertical-Cavity Surface -Emitting Lasers", Dept. of Optoelectronics, University of Ulm, Annual report 1995, pp. 102-105.

* cited by examiner

RESONANT CAVITY DIODE OPERATING AT THE SAME WAVELENGTH FOR EMISSION AND DETECTION OF LIGHT

TECHNICAL FIELD

This invention relates to a resonant cavity diode, and more precisely a particular structure of a vertical cavity laser diode called VCSEL, that can be used equally well as a light emitter or receiver (detector).

Remember that a VCSEL is a vertical cavity surface emitting laser. The acronym VCSEL will be used throughout the remainder of this description.

The particular structure according to the invention does not have the conventional limitations of known devices required to perform a dual emitter-receiver function and which will be discussed further in the following description.

The essential applications of the component according to the invention are:
conventional or three dimensional telemetry and
optical links or connections for data or telecommunications, and also connections between electronic cards and inside an electronic circuit.

We will now discuss the application to conventional or three-dimensional telemetry.

A VCSEL emits a light pulse that is reflected by an object and returns to this VCSEL. The light pulse is then retransformed into an electrical pulse. The distance of the object can be calculated knowing the time elapsed between the two pulses.

If a matrix of components (VCSELs) is used, the start pulse is emitted by only one of the components of the matrix, but the reflected pulse is received by all components of this matrix. Time offsets that differ depending on the point considered on the matrix, are used to determine the distance and the shape of the object. Moreover, point by point scanning of the matrix provides a view of the object from several angles.

We will now return to the application to optical connections for data or telecommunications and to connections between electronic cards or inside an electronic circuit.

The space and weight saving obtained as a result of the structure according to the invention may provide advantages in the aeronautics and space industries. Finally, it is easy to envisage reconfiguration of a network with this type of component.

If the invention is applied to a LED (Light Emitting Diode) placed in a resonant cavity to form what is called an RCLED, the result is a hybrid diode that is both emitting and receiving.

Remember that an RCLED is a resonant cavity light emitting diode. It is a structure that is practically identical to the structure of a VCSEL. The essential difference between these structures lies in the reflectivity of mirrors, which is much lower for the RCLED. In the RCLED, no attempt is made to obtain the laser effect, but simply to make the diode brighter.

The component resulting from application of the invention to an RCLED can then be used as an end component with plastic optical fibers in low cost connections, for example for the automotive industry.

The structure of a LED placed in a resonant cavity is almost identical to the structure of a VCSEL, as described above. Thus, the principle described above for VCSELs is directly applicable to RCLEDs.

STATE OF PRIOR ART

Firstly, we will like to include a technical summary about VCSELs used as light emitters, in other words conventionally, before going onto VCSELs used as light detectors.

Like any laser, a VCSEL comprises two mirrors that delimit a resonant cavity, and a gain medium that is placed in this cavity and is generally formed from quantum wells. All these elements are the result of the stack of appropriate semiconducting layers on a semi-conducting substrate.

In a conventional laser diode, for example such as a stripe laser, mirrors are obtained by cleavage of the structure deposited on the substrate.

The difference in the optical index between air (with an index equal to 1) and the semiconducting material of the structure (with an index equal to 3 or 4) creates an interface that reflects light. In this way, a relatively low reflectivity of about 30% is obtained.

On the other hand, since the cavity obtained measures a few hundred micrometers, the interaction between the photons and the gain medium is facilitated and the gain is high.

In the case of VCSELs, mirrors are obtained by alternating quarter wave coats of semiconductors with a high optical index and a low optical index respectively.

Note that most VCSELs marketed at the moment are made using the family of GaAs and AlAs binary alloys and the $Ga_{1-x}Al_xAs$ ternary alloy that is a solid solution of the previous two binary alloys.

The optical indexes of GaAs and AlAs in the near infrared range are equal to approximately 3.5 and 2.9 respectively. Therefore, by varying the aluminium content x in the ternary alloy $Ga_{1-x}Al_xAs$, the optical index can be varied within the range from 2.9 to 3.5.

We will now reconsider VCSELS mirrors. By stacking a sufficiently large number of coats, we can obtain a mirror with high reflectivity (typically 99.9%) at the emission wavelength of the VCSEL in which this mirror is located. This high reflectivity provides a means of compensating for the low gain of the amplifying part of the VCSEL. Unlike a stripe laser, light passes through this part perpendicularly and the interaction length is very short.

Therefore, the situation can be summarized as follows:
1. A stripe laser has a high gain, a long cavity and low reflectivity mirrors.
2. A VCSEL has a low gain, a short cavity and high reflectivity mirrors.

FIG. 1 diagrammatically illustrates the structure of a conventional stripe laser. This figure shows the cavity 2 of this laser which is between two cleaved faces composed of mirrors 4 and 6.

FIG. 2 diagrammatically illustrates the structure of a conventional VCSEL comprising a first Bragg mirror 8 deposited on a substrate 10, a cavity 12 that is made of GaAlAs in the example and contains a gain medium composed of one or several quantum wells, and a second Bragg mirror 16.

The mirrors 8 and 16 are stacks in which layers 8a and 16a respectively of a semiconducting material with a low optical index alternate with layers 8b and 16b respectively of a semiconducting material with a high optical index.

The optical length of the cavity 12 delimited by the two mirrors is generally equal to k×λ, where λ is the operating wavelength of the VCSEL and k is an integer number greater than or equal to 1. This is why this cavity is called a <<k×λ cavity>>.

Remember that the optical length of the cavity is the length obtained by multiplying the real length of this cavity by the optical index of the material from which the cavity is made. For example, with GaAs for which the index is equal to about 3.5, it is possible to deposit 850/3.5=242.86 nm of GaAs by choosing k equal to 1, to make a cavity resonant at a wavelength of 850 nm. The real thickness of the GaAs layer is then 242.86 nm and its optical length is equal to 850 nm.

In general, the substrate 10 and the first mirror 8 are made of N type semiconducting materials. The cavity 12 is not doped and the second mirror 16 or the upper mirror is made of P type semiconducting materials.

Resistive electrical contacts 18 and 20 are made by forming a metal on the back face of the substrate 10 and on the top mirror 16. In general, this metal is an alloy of gold and an N or P type doping agent (for example Ge or Zn) and metals (for example Ti, Pt, Ni) are added to this alloy to act as diffusion barriers or to improve the bond.

The top contact 20 is annular to enable the laser beam F generated by the VCSEL to pass through.

In the structure represented in FIG. 2, the current lines L1 obtained when a voltage is applied between electrodes 18 and 20, are not guided.

An attempt is also made to reduce the current threshold of the VCSEL in FIG. 2. The most elegant solution found is the lateral oxidation technique. This technique consists of including a layer of GaAlAs with a high aluminium content in the cavity, at least on one side of the quantum wells. This layer is usually placed between the wells and the top mirror.

After epitaxy to form the stack of mirrors and the resonant cavity, the resulting sample is etched to expose the sides of the cavity and the complete assembly is placed in an oxidizing atmosphere, usually in a furnace in which the temperature is increased to about 400° C. and in which steam is made to penetrate.

The layer of GaAlAs with a high aluminium content is then transformed into an aluminium oxide AlOx that is an electrical insulation. If the oxidation rate of GaAlAs is known, the process can be stopped before the layer is fully oxidized to obtain an electrically insulating ring.

This technique provides means of concentrating current lines and increasing the current density, which has the effect of reducing the VCSEL operating threshold.

FIGS. 3 and 4 show diagrammatic views of the VCSEL structure, before and after lateral oxidation respectively. The same elements shown in FIGS. 2, 3 and 4 are marked with the same references.

The coat of GaAlAs with a high aluminium content is marked with reference 22 in FIG. 3 and the electrically insulating ring made of AlOx is marked with reference 24 in FIG. 4. Concentrated current lines are shown in FIG. 4 and are marked with reference L2.

For a VCSEL, the diameters obtained are usually within the intervals 5 to 10 µm for the unoxidized central window (the area through current passes) and a few tens of micrometers for the total diameter of the insulating ring.

We will now give a few reminders about VCSELs used as detectors or operating as hybrids (as emitters and detectors).

It is known that a VCSEL can also be used as a light detector (see document [1] that, like all the other documents mentioned in the following, is referenced at the end of this description).

The VCSEL structure is completely reversible, and all that is necessary to make it into a very selective photo detector is to illuminate it with a source centered on the emission wavelength of this VCSEL, because only light centered on the resonant peak of the cavity included in it can penetrate.

The reflectivity of one of the mirrors (references 8 to 16 in FIGS. 2 to 4) can also be varied to adjust the selectivity of the photo detector (see document [2]). If dual layers are removed from one of these mirrors, the detection window is widened (a dual layer being a pair of adjacent layers (for example 8a and 8 b)).

On the other hand, if dual layers are removed from a mirror, the laser effect can no longer take place in the VCSEL. In this case the situation is very poor since the gain is low and the reflectivity of the mirror is also low. This is the first serious disadvantage of this technique: it is impossible to obtain a hybrid laser. This solution must be reserved solely for LEDs in resonant cavities. However, we will see that there is another more serious disadvantage.

If the top mirror is left intact, a distinction has to be made between two cases: the case of a first generation VCSEL (FIG. 2) and the case of a VCSEL with lateral oxidation (FIG. 4). The result in the first case is a hybrid component but this component has the disadvantage that it has a high operating threshold when it is used as an emitter.

A second problem arises in the second case: the optical path in the cavity is not the same when the oxidized layer is passed through and when it is not (the optical index of the oxidized layer being about 1.6), such that the VCSEL detects at two different wavelengths, corresponding to two optical thicknesses of the cavity (see documents [3] and [4]).

Furthermore, if it is required to increase the efficiency of detector mode, it is useful to slightly increase the diameter of the VCSEL. The part facing the oxide AlOx then becomes larger and the detector responds preferentially to a wavelength shorter than the wavelength of the laser part.

Consequently, this VCSEL will be incapable of detecting light from another VCSEL emitting at the same wavelength as itself. Therefore, a secondly VCSEL will have to be associated with the first VCSEL, emitting at shorter wavelength. This second component will also be incapable of detecting light from the first since it will detect light at even shorter wavelength, etc., thus setting up a vicious circle.

Moreover, if a VCSEL is used to illuminate an object, this VCSEL would not used to detect light reflected by this object.

Therefore, it is impossible to form a bi-directional connection with hybrid VCSELs. This is the second serious disadvantage.

PRESENTATION OF THE INVENTION

The purpose of this invention is to overcome the above-mentioned disadvantages. In particular, it is intended to solve the following problem.

If a VCSEL is made for use both as an emitter and a detector, the result is either an emitter that is not optimized, or a device that does not correctly detect at the same wavelength as the emitting part.

Specifically, the purpose of this invention is a resonant cavity diode capable of emitting and detecting light with a wavelength λ, this diode comprising:

first and second mirrors, a resonant cavity delimited by these first and second mirrors, an active medium contained in this cavity and capable of emitting and detecting light, a first electrically insulating ring parallel to the first and second mirrors and placed in the cavity on one side of the active medium, this first ring defining two parts in the cavity, namely a first cylindrical part passing through the first ring and a second part that contains this first ring, this diode being characterized in that it further comprises at least one second electrically insulating ring parallel to the first and second mirrors and placed in the cavity on one side of the active medium, this second ring being contained in the second part of the cavity and having the same inside diameter and the same outside diameter as the first ring, the total thickness of the first and second rings being provided such that the optical length of the resonant cavity is k×λ in the first part, and (k−1)×λ in the second part, where k is an integer number equal to at least 2.

According to one preferred embodiment of the diode according to the invention, the first and second rings are formed by partial oxidation of semiconducting layers parallel to the first and second mirrors and included within the cavity, oxidation taking place throughout the portion of these layers located in the second part of the cavity and where k is greater than n1/(n1−n2), where n1 and n2 denote the optical index of the material from which the semiconducting layers are made and the optical index of this material after oxidation, respectively.

According to one particular embodiment of the diode according to the invention, the cavity is made of a ternary semiconducting material $A_{1-x}B_xC$, capable of being oxidized, where $0 \leq x \leq 1$.

The chemical elements A, B and C can be Ga, Al and As respectively.

According to a first particular embodiment of the invention, the active medium is a gain medium and the diode is a vertical cavity surface emitting laser.

According to a second particular embodiment of the invention, the active medium is capable of emitting and detecting light and the diode is a resonant cavity light emitting diode.

This invention also relates to a telemeter comprising the diode according to the invention that forms a vertical cavity surface emitting laser.

The invention also relates to a light emitter-receiving component, comprising a matrix of diodes according to the invention.

The invention also relates to a three dimensional telemeter, comprising a matrix of diodes according to the invention, each of these diodes forming a vertical cavity surface emitting laser.

The invention also relates to a bi-directional optical connection comprising:
two emitting-receiving diodes according to the invention, and
an optical waveguide connecting these two diodes.

BRIEF DESCRIPTION OF THE FIGURES

This invention will be better understood after reading the description of example embodiments given below, for guidance only and in no way limitatively, with reference to the appended drawings wherein.

DETAILED PRESENTATION OF PARTICULAR EMBODIMENTS

Figure 4:
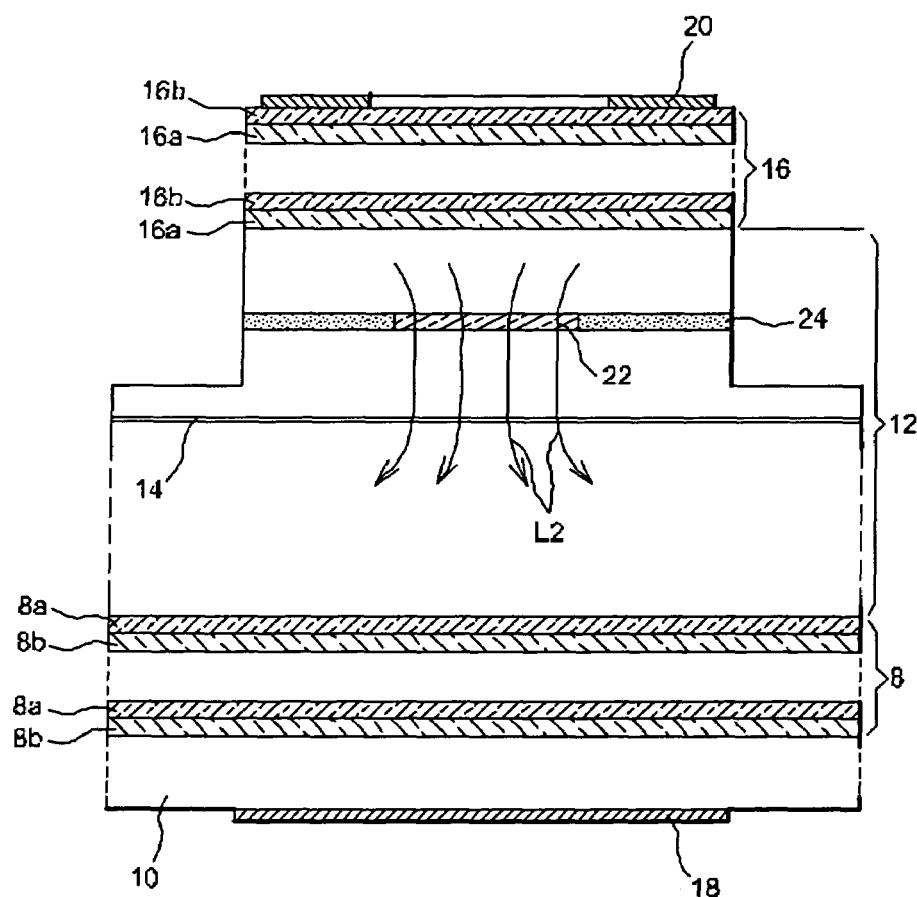
FIG. 4 is a diagrammatic sectional view of this other VCSEL after oxidation of this layer and has already been described.

According to the invention, the solution to the problem mentioned above consists of adding one or several oxidizable layers to the existing layer (layer 24), for a VCSEL of the type shown in FIG. 4. These layers are redundant for the current line guidance function, but they enable local transformation of the k×λ cavity into an (k−1)×λ cavity.

Figure 1:
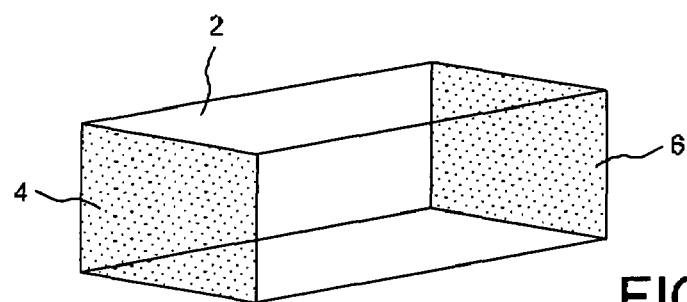
FIG. 1 is a diagrammatic perspective view of the structure of a classical stripe laser and has already been described.
Figure 2:
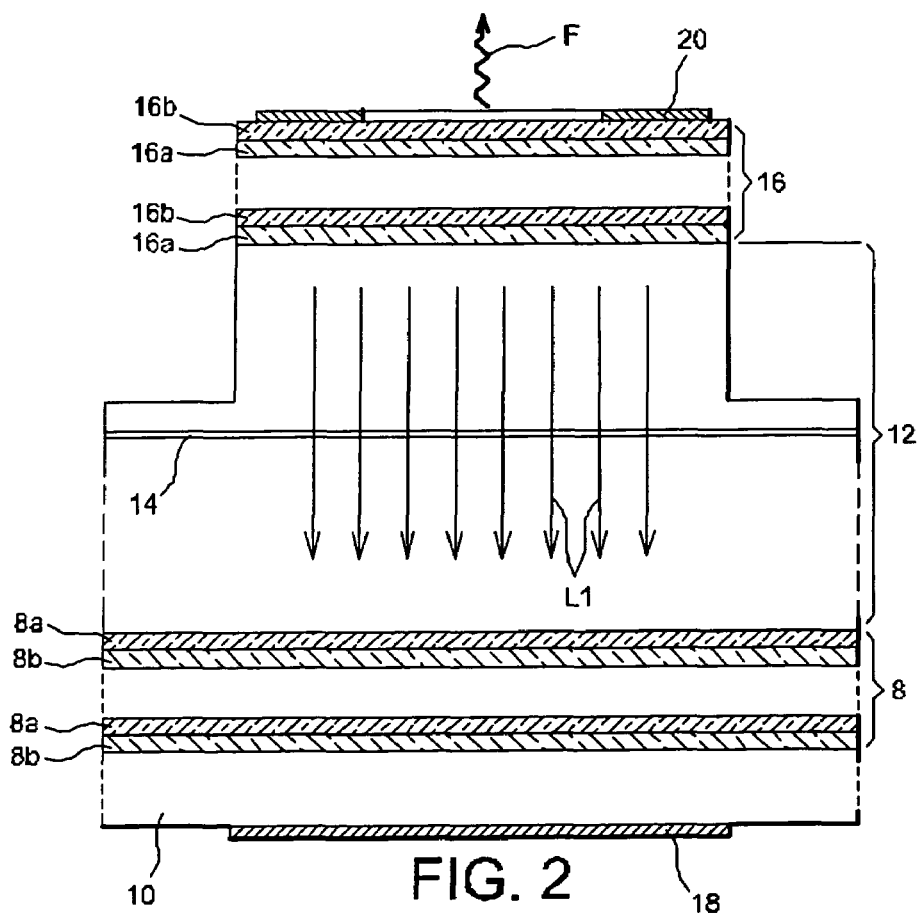
FIG. 2 is a diagrammatic sectional view of a known VCSEL structure and has already been described.
Figure 3:
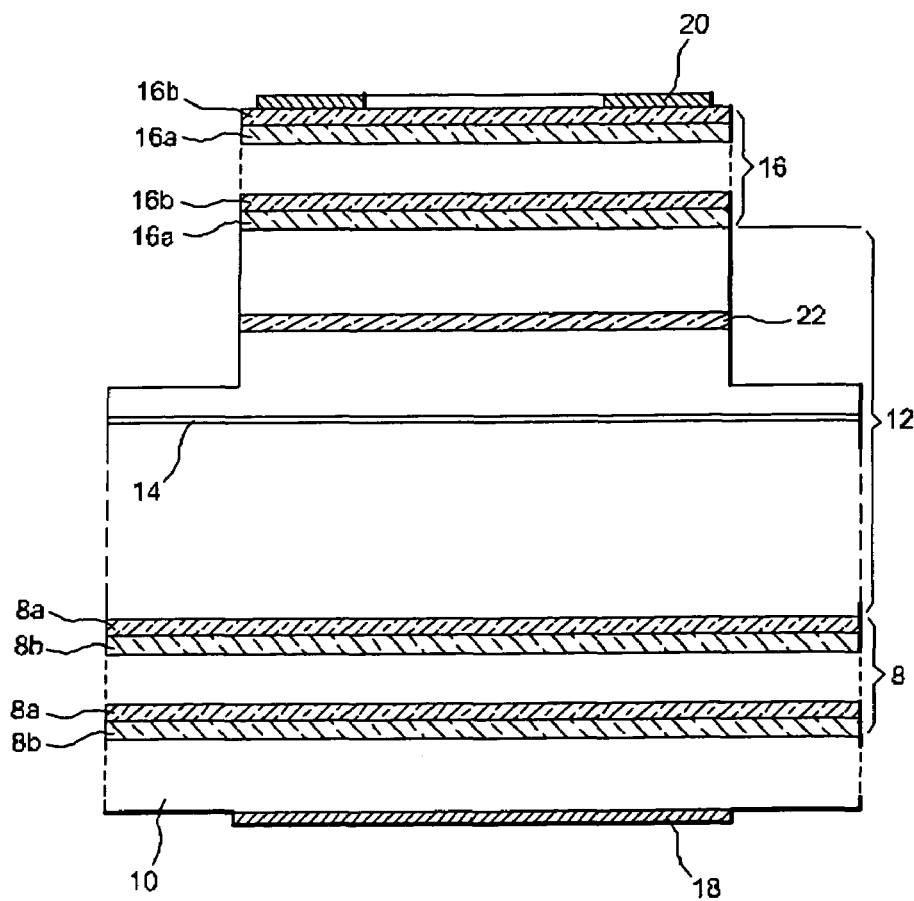
FIG. 3 is a diagrammatic sectional view of another known VCSEL, for which the cavity contains a layer that will be oxidized and that has already been described.

The k×λ cavity is changed to a (k−1)×λ cavity based on the fact that the optical index of AlAs changes from 2.9 to about 1.6 when it is oxidized in AlOx (considering the special case in which layer 22 in FIG. 3 is made of $Ga_{1-y}Al_yAs$, where y=1). The real thickness of AlAs hardly varies, but its optical thickness is strongly reduced.

All that is necessary is to use a sufficient total thickness of AlAs so that the change in the optical length is equal to exactly λ. Therefore the thicknesses must satisfy the following equations, in the special case in which the cavity is made of $Ga_{1-x}Al_xAs$, where x=0.

$$N(AlAs)xd(AlAs)+N(GaAs)xd(GaAs)=k\times\lambda \quad (1)$$

$$N(AlOx)xd(AlAs)+N(GaAs)xD(GaAs)=(k-1)\times\lambda \quad (2)$$

In these equations, N(AlAs), (N(AlOx) and N(GaAs) denote the optical index of AlAs, the optical index of AlOx and the optical index of GaAs respectively, and D(AlAs) and D(GaAs) denote the total thickness of AlAs and the total thickness of GaAs, respectively.

Equation (1) describes the optical length of the cavity before oxidation and equation (2) describes the optical length of the same cavity after oxidation. After subtracting (2) from (1) member by member, the result is:

$$N(AlAs)-n(AlOx))xd(AlAs)=\lambda \quad (2a)$$

The thickness of AlAs to be transformed into AlOx oxide is deduced:

$$d(AlAs) = \frac{\lambda}{N(AlAs) - N(AlOx)} \quad (3)$$

By substituting the value of d(AlAs) given by (3) in (1), the result is:

$$\frac{N(AlAs)}{N(AlAs) - N(AlOx)}x\lambda + N(GaAs)xD(GaAs) = kx\lambda \quad (4)$$

The thickness of GaAs to be used for the rest of the cavity is deduced as follows:

$$D(GaAs) = \frac{1}{N(GaAs)} \times \left(k - \frac{N(AlAs)}{N(AlAs) - N(AlOx)}\right) \times \lambda \quad (5)$$

with the important condition:

$$k > \frac{N(AlAs)}{N(AlAs) - N(AlOx)} \text{ and } k \text{ is an integer} \quad (6)$$

The oxidation process may cause a very slight variation in the thickness of the layer of AlAs. In this case, a correction factor C can be introduced into the equation (2) replacing d(AlAs) by Cxd(AlAs).

Those skilled in the art would easily transpose the previous inequality and equations to the case of using other semiconductors and oxides are used, and particularly to the case in which the cavity 12 and the layer 22 would be made of $Ga_{1-x}Al_xAs$ and $Ga_{1-y}Al_yAs$ respectively, where y is more than x, and preferably more than 10× (and $x \geq 0$, $y \leq 1$).

We will use an example to illustrate the above.

The numeric values of the optical indexes used in this example are approximate values. obviously, more precise values can be calculated for the GaAlAs system. In particular, references [5] and [6] give more precise numeric models.

In this example, the average values of optical indexes at 850 nm are as follows:

n(AlAs)=2.9
n(GaAs)=3.5
n(AlOx)=1.6

With these values, equations (1) to (5) and the inequality (6) give k>2, 23 where k is an integer, in other words $k \geq 3$.

Therefore, it is necessary to make a cavity equal to at least 3×λ for this set of optical indexes. In this case, equation (3) can be used to calculate the thickness of AlAs to be used (653.8 nm) and one of the two equations (1) and (2) gives the thickness of GaAs (186.8 nm) necessary to complete the cavity.

The following table I summarizes numeric values for the 3×λ, 4×λ and 5×λ cavities.

TABLE I

|  | GaAs | AlAs |
|---|---|---|
| 3×λ | 186.8 nm | 653.8 nm |
| 4×λ | 429.7 nm | 653.8 nm |
| 5×λ | 672.5 nm | 653.8 nm |

The thickness of AlAs can be distributed in several layers and these layers can be arranged on a single side of the quantum wells on each side of these wells.

Figure 5:
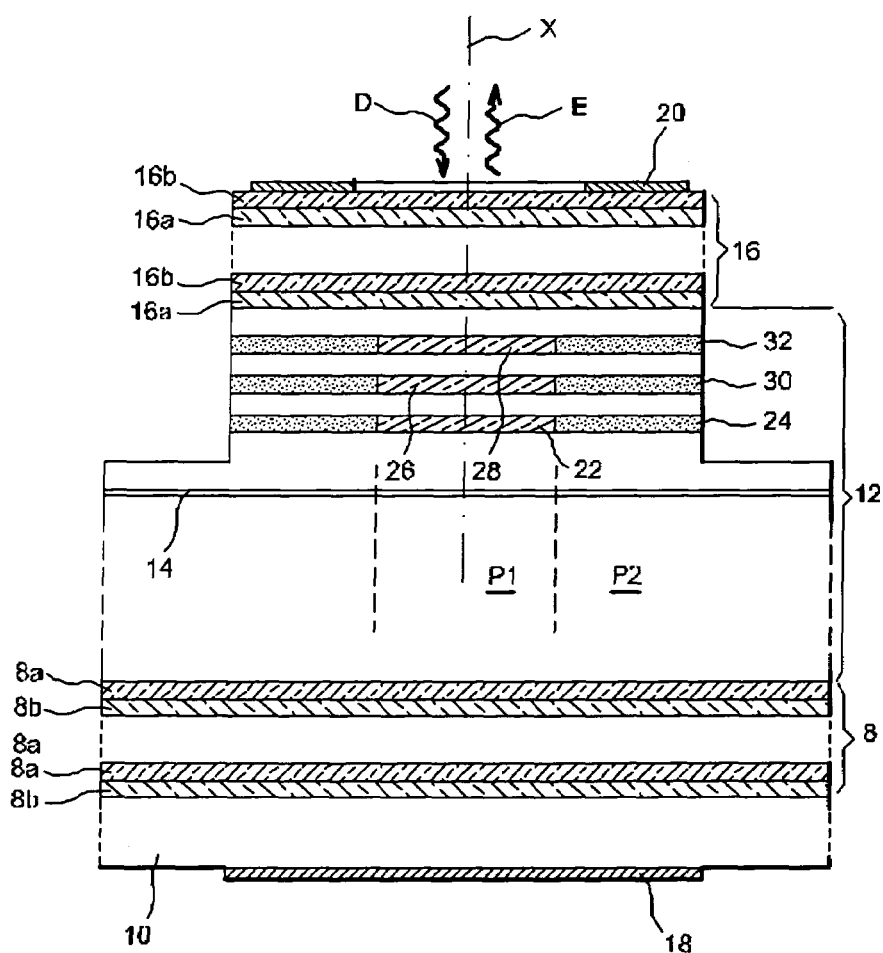
FIG. 5 is a diagrammatic sectional view of a VCSEL according to the invention, FIG. 6 diagrammatically illustrates application of this invention to three-dimensional telemetry, and FIG. 7 diagrammatically illustrates application of this invention to the formation of a bi-directional optical connection.

FIG. 5 illustrates the example given above for a diode conforming to the invention, operating at the same wavelength λ for light emission E and light detection D. Identical elements in FIGS. 4 and 5 are marked with the same references.

Compared with the resonant cavity 12 of the VCSEL in FIG. 4, the resonant cavity 12 of the VCSEL in FIG. 5 contains two additional layers 26 and 28 that are identical to layer 22 and are parallel to it (and therefore to mirrors 8 and 16). These two additional layers were inserted during epitaxy, leading to stacking as can be seen in FIG. 5.

The oxidation process described above was used to partially oxidize the three layers 24, 26 and 28 to obtain three parallel and electrically insulating rings 24, 20 and 32 made of AlOx. These rings have the same inside diameter and the same outside diameter and a common axis X forming the axis of the VCSEL.

As described above, the rings could be distributed on each side of the layer of quantum wells 14 forming the gain medium.

Several layers of the gain medium could also be used and insulating rings could be distributed on each side of these gain medium layers.

Therefore, the result is a cavity in two parts defined by the rings 24, 30 and 32, namely a central cylindrical part P1 for which the axis is the X axis and that passes through the rings and forms a local cavity k×λ, and a tubular part P2 that contains the rings, surrounds the part P1 and forms a local cavity (k−1)×λ.

Note that layers of AlAs can be oxidized to a thickness of about 250 nm (see document [7]). However in a real laser, it is better to use lower thicknesses (see document [8]) to prevent problems due to changing the thickness of this AlAs layer).

We will now give some example applications of the invention.

Figure 6:
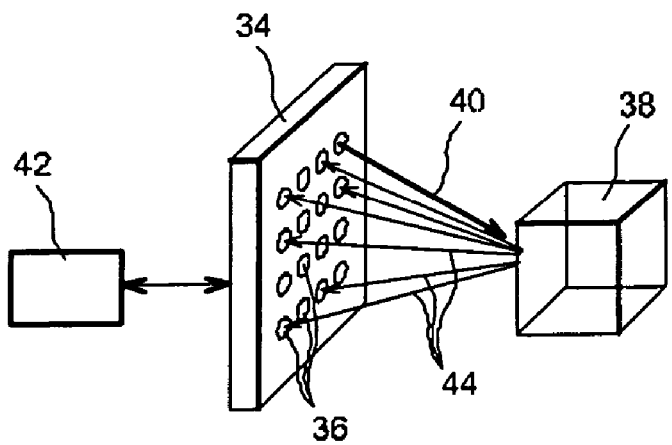

FIG. 6 diagrammatically shows an example of a three-dimensional telemeter comprising a matrix 34 of emitter-receiver VCSELs 36 according to the invention. An object 38, for example a cube, receives a light pulse 40 sent by the first of the VCSELs in the matrix, which is provided with electronic control and processing means 42. A lens not shown (for example a lens or a group of lenses) may also be placed between the matrix and the cube.

The pulse is reflected by the different points on the object and is detected by the other VCSELs in the matrix which are then used as detectors. The electronic means 42 calculate time offsets between the different reflected and detected pulses 44. The second VCSEL in the matrix then emits a pulse and the other VCSELs detect the reflected pulse, etc.

Therefore, scanning is used in which each VCSEL is used as an emitter and a receiver. The result is that the shape of the object can be reconstituted with this type of telemeter.

The invention is also applicable to the formation of bi-directional optical connections. This is illustrated diagrammatically in FIG. 7, which shows two emitter-receiver VCSELs 46 and 48 according to the invention.

These VCSELs are connected through an optical fiber 50 and are provided with electronic control means 52 that manage communications between VCSELs. These VCSELs swap over in turn to act in emitter mode and in receiver mode. By detecting the end of a message marked by a clearly defined sequence, the electronic means 52 use one operating mode or the other.

For example, the following is one possible sequence: send a signal by component 46, reception by component 48, response by component 48 that changes to emission mode, reception by component 46 that changes to reception mode.

The invention is not limited to VCSELs. It is also applicable to RCLEDs. For example, the structure of an RCLED according to the invention in shown in FIG. 5, except that the reflectivity of the mirrors is lower.

Figure 7:
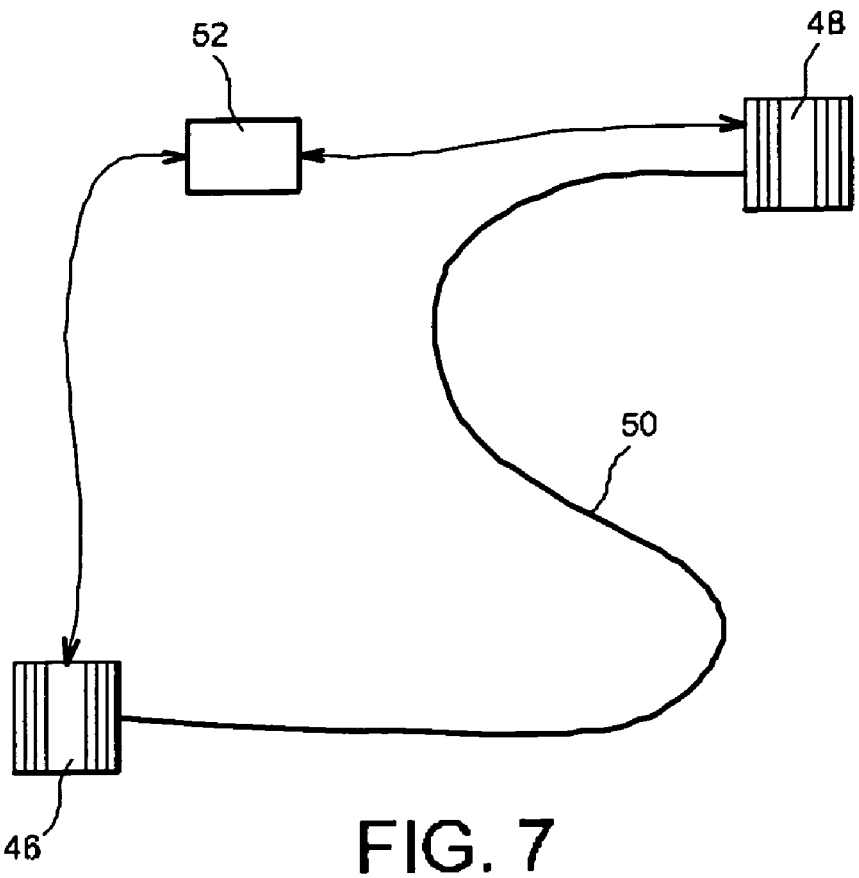

For example, a bi-directional connection of the type shown in FIG. 7 could be formed by connecting two RCLEDs through an optical fiber.

The following documents are mentioned in this description:

[1] H. Kosaka, I. Ogura, M. Sugimoto, H. Saito, T. Numai and K. Kasahara, "Pixels consisting of double vertical-cavity detector and single vertical-cavity laser sections for 2-D bi-directional optical interconnections", Jpn. J. Appl. Phys., vol. 32, 1993, pp. 600–603

[2] T. Knodl, H. K. H. Choy, J. L. Pan, R. King, R. Jäger, G. Lullo, J. F. Ahadian, R. J. Ram, C. G. Fonstad, Jr., and K. J. Ebeling, "RCE Photodetectors based on VCSEL Structures", IEEE PHOTONICS TECHNOLOGY LETTERS, vol. 11, No. 10, 1999, pp. 1289–1291

[3] K. D. Choquette, K. L. Lear, R. P. Schneider, Jr. and K. M. Geib, "Cavity characteristics of selectively oxidized vertical-cavity lasers", Appl. Phys. lett. 66 (25), 1995, pp. 3413–3415

[4] K. L. Lear, K. D. Choquette, R. P. Schneider, Jr. and S. P. Kilcoyne, "Modal analysis of a small surface emitting laser with a selectively oxidized waveguide", Appl. Phys. lett. 66 (20), 1995, pp. 2616–2618

[5] F. L. Terry, Jr., "A modified harmonic oscillator approximation scheme for the dielectric constants of $Al_xGa_{1-x}As$", J. Appl. Phys., 70 (1), 1991, pp. 409–417

[6] M. A. Afromowitz, "Refractive index of $Ga_{1-x}Al_xAs$", Solid State Com., vol. 15, 1974, pp. 59–63

[7] M. Osinski, T. Svimonishvili, G. A. Smolyakov, V. A. Smagley, P. Mackowiak, and W. Nakwaski, "Temperature and Thickness Dependence of Steam Oxidation of AlAs in Cylindrical Mesa Structures", IEEE PHOTONICS TECHNOLOGY LETTERS, vol. 13, No. 7, 2001, pp. 687–689

[8] B. Weigl, "High-Efficiency Selectively-Oxidized MBE-Grown Vertical-Cavity Surface-Emitting Laser", Annual report 1995, Dept. of Optoelectronics, University of Ulm, pp. 102–105.

The invention claimed is:

1. Resonant cavity diode capable of emitting and detecting light with a wavelength $\lambda$, this diode comprising:
    first and second mirrors;
    a resonant cavity delimited by these first and second mirrors;
    an active medium contained in this cavity and capable of emitting and detecting light;
    a first electrically insulating ring parallel to the first and second mirrors and placed in the cavity on one side of the active medium, this first ring defining two parts in the cavity, namely a first cylindrical part passing through the first ring and a second part that contains this first ring; and
    at least one second electrically insulating ring parallel to the first and second mirrors and placed in the cavity on one side of the active medium, this second ring being contained in the second part of the cavity and having the same inside diameter and the same outside diameter as the first ring, the total thickness of the first and second rings being provided such that the optical length of the resonant cavity is $k \times \lambda$ in the first part (P1) and $(k-1) \times \lambda$ in the second part (P2), where k is an integer number equal to at least 2.

2. Diode according to claim 1, in which the first and second rings are formed by partial oxidation of semiconducting layers parallel to the first and second mirrors and included within the cavity, oxidation taking place throughout the portion of these layers located in the second part of the cavity and where k is greater than n1/(n1−n2), where n1 and n2 denote the optical index of the material from which the semiconducting layers are made and the optical index of this material after oxidation, respectively.

3. Diode according to claim 2, in which the cavity is made of a ternary semiconducting material $A_{1-x}B_xC$, capable of being oxidized, where $0 \leq x \leq 1$.

4. Diode according to claim 3, in which the chemical elements A, B and C are Ga, Al and As respectively.

5. Diode according to claim 1, in which the active medium is a gain medium and the diode is a vertical cavity surface emitting laser.

6. Diode according to claim 1, in which the active medium is capable of emitting and detecting light and the diode is a resonant cavity light emitting diode.

7. Telemeter comprising the diode according to claim 5.

8. Light emitter-receiving component, comprising a matrix of diodes according to claim 1.

9. Three dimensional telemeter, comprising a matrix of diodes according to claim 5.

10. Bi-directional optical connection comprising:
    two emitting-receiving diodes according to claim 1; and
    an optical waveguide connecting these two diodes.

* * * * *